United States Patent
Kato

Patent Number: 6,104,194
Date of Patent: Aug. 15, 2000

[54] METHOD OF DETECTING SECONDARY ELECTRON CHARGE IN A CATHODE RAY TUBE

[75] Inventor: Hideo Kato, Bridgend, United Kingdom

[73] Assignees: Sony Corporation, Tokyo, Japan; Sony United Kingdom Limited, Weybridge, United Kingdom

[21] Appl. No.: 09/019,783

[22] Filed: Feb. 6, 1998

[30] Foreign Application Priority Data

Feb. 13, 1997 [GB] United Kingdom .................... 9702924

[51] Int. Cl.[7] .......................... G01R 31/00; H01J 29/16; H01J 29/50; H04N 17/00
[52] U.S. Cl. ...................... 324/404; 313/364; 313/412; 313/413; 348/190
[58] Field of Search ....................... 324/404; 313/364, 313/417, 413, 421, 440; 250/205; 164/452; 348/180, 189, 190, 191, 744, 745, 746, 747

[56] References Cited

U.S. PATENT DOCUMENTS

| | | |
|---|---|---|
| 4,988,857 | 1/1991 | Karasawa et al. ................. 250/205 |
| 5,081,393 | 1/1992 | Kinami ................................ 313/412 |
| 5,273,102 | 12/1993 | Lillquist et al. .................... 164/452 |
| 5,565,731 | 10/1996 | Han .................................... 313/440 |
| 5,804,913 | 9/1998 | Grubben et al. .................... 313/440 |

*Primary Examiner*—Josie Ballato
*Assistant Examiner*—James Kerveros
*Attorney, Agent, or Firm*—Frommer Lawrence & Haug, LLP; William S. Frommer; Joe H. Shallenburger

[57] ABSTRACT

In a method for determining whether electronic charge has been accumulated on the inner surface of a cathode ray tube (10), at least one electron beam is generated within the cathode ray tube and is deflected so that it hits the inner surface of the funnel (14) of the cathode ray tube. The temperature of a portion of the cathode ray tube is measured and is compared with a reference temperature value. If the measured temperature is greater than or equal to the reference temperature, it is determined that the electronic charge has accumulated. If the measured temperature is below the reference temperature, then the electron beam or beams have become switched off and electronic charge may not have accumulated on the inner surface of the cathode ray tube.

17 Claims, 2 Drawing Sheets

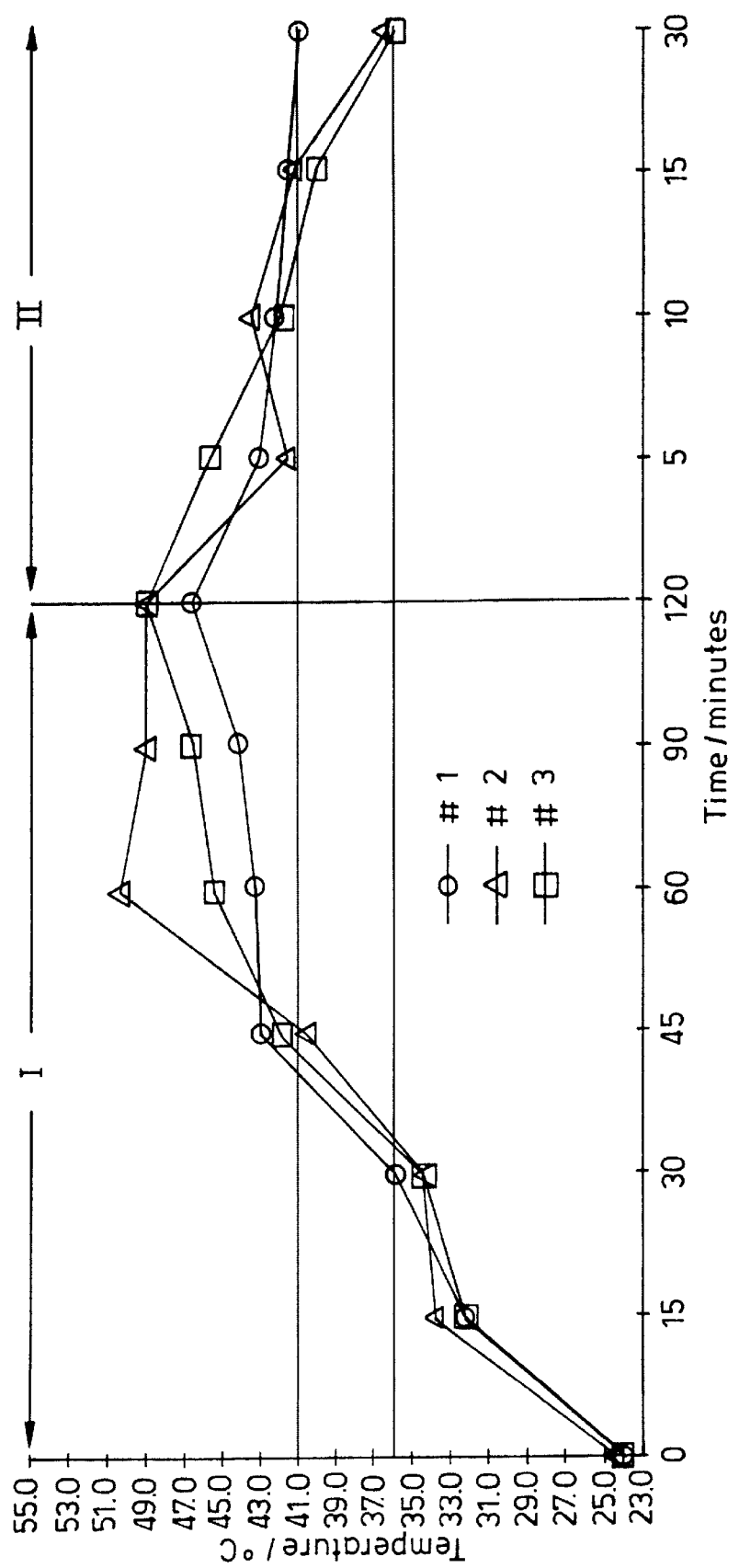

METHOD OF DETECTING SECONDARY ELECTRON CHARGE IN A CATHODE RAY TUBE

BACKGROUND OF THE INVENTION

1. Field of the Invention

This invention relates to a method of detecting secondary electron charge on the inner surface of the neck of a cathode ray tube. The method of the invention is particularly useful during manufacture of the cathode ray tube.

2. Description of the Prior Art

In a display device, such as a television or monitor, which uses a cathode ray tube (CRT), electronic charge accumulates on the inner surface of the side walls of the tube around the neck during the course of normal use of the CRT. This charge, known as secondary electron charge, originates from the electron beams within the CRT, and generates an electric field which subsequently influences the electron beams. This can cause problems particularly, but not exclusively, with the convergence of the beams in a 3 electron gun type CRT e.g. for a colour TV or RGB monitor.

It is necessary to adjust the display device to compensate for the secondary electron charge. The convergence is usually adjusted by altering the position of a ring magnet provided on the neck of the CRT. However, when the CRT has just been manufactured there is no secondary electron charge on the neck, so if the convergence is adjusted in that condition, mis-convergence, also called jumping convergence or convergence drift, will occur later when the device is in use and secondary electron charge has been generated.

It has been proposed to generate secondary electron charge during the ageing process which the CRT undergoes following fabrication so that the convergence can then be adjusted under conditions similar to those of the device in use to avoid the mis-convergence problem. The secondary electron charge that accumulates on the inner surface of the neck of the CRT persists for at least one year even with the CRT not in use, therefore the secondary electron charge needs to be generated only once and then the convergence adjustments made will be correct for most future use of the CRT.

The above mentioned ageing process is done on a partially assembled display device including a CRT mounted on a pallet on a conveyor of a production line. The ageing process typically consists of subjecting the CRT to a temperature of 40° C. for 2 hours with the electron beams switched on, but just displaying a white field. The device is then allowed to cool before the convergence is adjusted. It has been found experimentally that sufficient secondary electron charge is generated for the mis-convergence to be compensated for if the following condition is satisfied:

$$B \times t \geq 6000 \quad (1)$$

where B is the screen brightness in cd/m$^2$ and t is the ageing time in minutes.

A problem can arise during the ageing process because of the device entering the stand-by mode, also known as the protection mode or power saving mode. This might occur as a result of a poor electrical connection between the device on the pallet and the pallet on the conveyor, especially when the pallet is transferred from one conveyor to another, in the ageing process, or may be the result of the initial parameter settings of the device. If the device is in the stand-by mode for some or all of the ageing process, then insufficient secondary electron charge will be accumulated on the inner surface of the neck of the CRT since the above condition (1) will not have been fulfilled. The convergence will not then be correctly adjusted causing mis-convergence in later operation of the device.

In the above procedure there is no way of proving that the secondary electron charge had been generated, as it is not practical to measure the secondary electron charge directly.

SUMMARY OF THE INVENTION

It is therefore an object of the present invention to alleviate, at least partially, the aforementioned problems.

Accordingly, the present invention provides a method for determining whether electronic charge has been accumulated on the inner surface of a cathode ray tube. At least one electron beam is generated within the cathode ray tube and is deflected so that it hits the inner surface of the funnel of the cathode ray tube. The temperature of a predetermined portion of the cathode ray tube is measured and compared with a predetermined reference temperature value to determine whether electronic charge has been accumulated on the inner surface of the cathode ray tube.

This enables it to be determined that sufficient secondary electron charge has been accumulated so that the convergence can be corrected without requiring the device to be adjusted later when in use.

An embodiment of the invention will now be described, by way of example only, with reference to the accompanying drawings.

DESCRIPTION OF THE DRAWINGS

FIG. 3 is a graph of temperature versus time for several sample CRT devices.

DETAILED DESCRIPTION OF A PREFERRED EXEMPLARY EMBODIMENT

Figure 1:
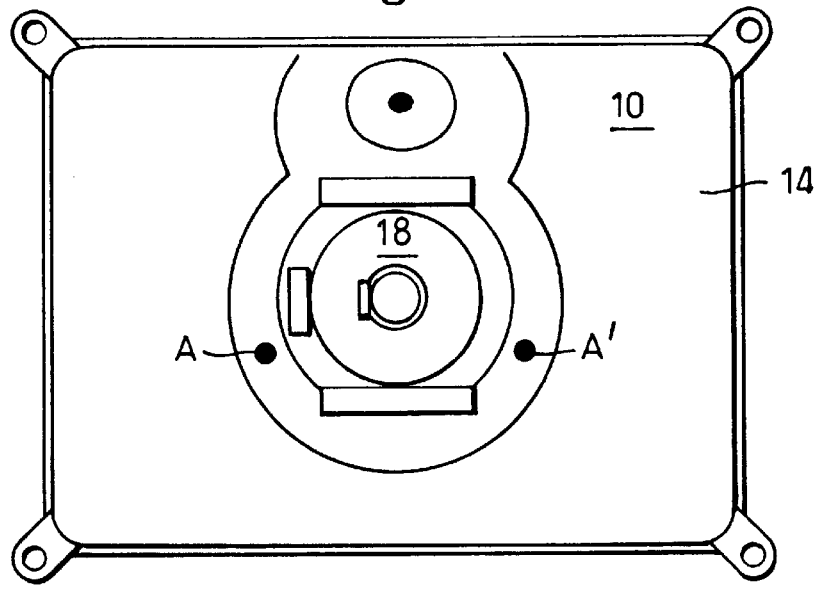
FIG. 1 shows a rear view of a CRT.
Figure 2:
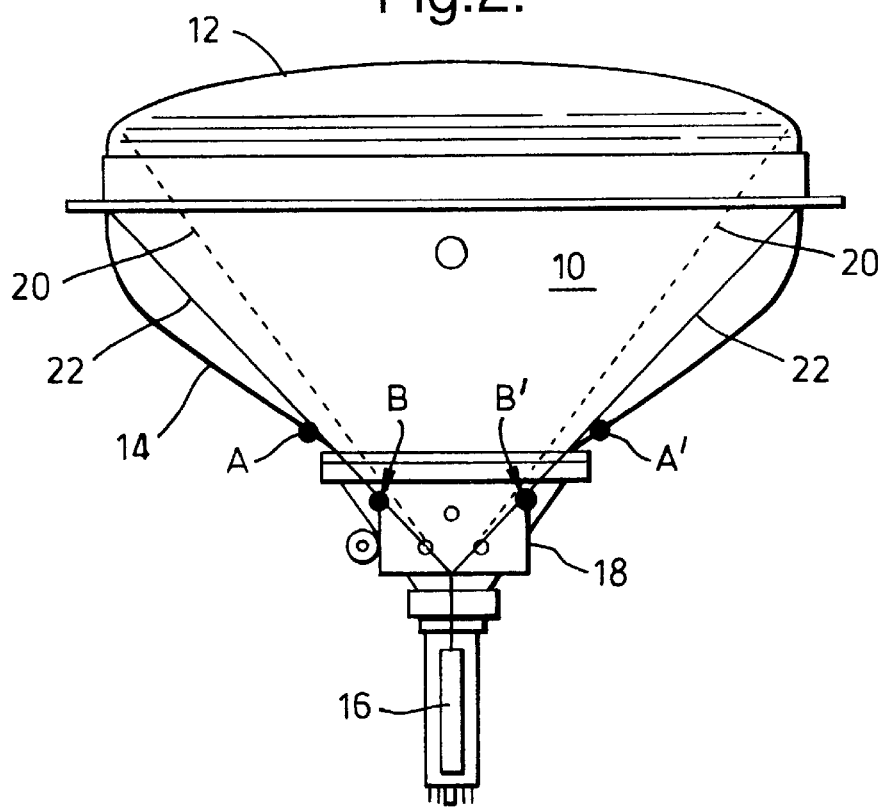
FIG. 2 is a diagrammatic view of a CRT showing the path of a deflected electron beam according to the invention.

FIGS. 1 and 2 show a CRT 10 comprising an evacuated glass envelope having a screen portion 12 and a funnel portion 14. At the tip of the funnel there are three electron guns 16 for producing three electron beams within the CRT to create a visible colour image in the known manner. The neck of the funnel portion 14 of the CRT is surrounded by a deflection yoke 18 for scanning the electron beams over the entire area of the screen portion 12 of the CRT. Two paths of the electron beams in normal use of the CRT 10 are shown by the dotted lines 20 in FIG. 2.

In one embodiment of the method of the present invention, the CRT device is switched on so that the electron guns generate electron beams. The electron beams are scanned in a raster pattern by applying appropriate signals to the circuitry of the deflection yoke 18. At the extremes of the scans the electron beams are deflected through an angle greater than the normal maximum deflection angle that is required to cover the screen portion 12 of the CRT 10. Two paths of the electron beams at such extreme deflections according to the invention are indicated by the solid lines 22 in FIG. 2. In this way the electron beams hit the inner surface of the funnel of the CRT 10 within the deflection yoke 18 at locations B and B' at their extremes of deflection.

According to one embodiment of the invention, a microprocessor (not shown) controls the beam deflection circuitry and has parameters applicable to different screen sizes. It is simple for the microprocessor to be given initial parameters so that the maximum deflection angle of the electron beams is automatically increased so that the electron beams hit the inner surface of the funnel of the CRT as described above, without any special adjustment of the CRT being required. Alternatively, or in addition, the deflection can be adjusted by means of a variable resistor.

It is a consequence of the electron beams hitting the neck that heat is generated which raises the temperature of that part of the CRT. In the preferred embodiment of the invention, the electron beam deflection process is carried out during an ageing process which involves the CRT being placed in a environment at 40° C. for 2 hours. During this period the overall electron beam current is set so that the screen brightness is 60 cd/m$^2$, but otherwise no picture signal is applied to the electron beams. This ageing time and brightness are sufficient to generate adequate secondary electron charge to enable compensating convergence adjustments to be made at a later stage. The heat generated by the electron beams hitting the CRT at points B and B' can raise the temperature above the ageing temperature.

The CRT is next allowed to cool in an environment at 25° C. A crosshatch signal may be applied to modulate the electron beams during this cooling process. The heat generated by the electron beams continuing to hit the neck means that that part of the CRT remains at a higher temperature for longer than if there is no electron beam, e.g. if for some reason the CRT device went into stand-by mode during the ageing process. A higher temperature indicates that the electron beams were on during the ageing process and therefore that the secondary electron charge has been generated.

In one embodiment of the invention, the temperature of a portion of the CRT is measured at a location on the funnel outside the yoke 18 and indicated by A or A' in FIGS. 1 and 2. These locations are remote from the regions B and B' where the electron beams hit the neck, but heat is conducted to A and A' so that they remain at a higher temperature for longer than they would if the electron beams did not hit the neck at all. It is more convenient to measure the temperature at A or A' because locations B and B' are inaccessible within the yoke 18, and because the yoke itself can be at an elevated temperature.

The surface temperature of either location A or A' is measured using a non-contact type thermometer. This type of thermometer is preferred because it can be conveniently set up in a position to measure the temperature of successive CRTs on a production line without having to be moved into and out of contact with the surface of each CRT. An example of a suitable thermometer is the Land Portable Infrared Thermometer, model Compac 3, by Minolta.

The graph of FIG. 3 shows the temperature variation of the location A or A' for three sample devices. Note that the horizontal axis is not linear. The following conditions were common for each device: ageing for 120 minutes at 40° C. in region marked I, and cooling at 25° C. in region II. The graph labelled #1 corresponds to a device in which the electron beams were deflected so as to hit the inner surface of the funnel of the CRT. Those labelled #2 and #3 show the temperature variation at point A or A' for devices with no electron beams generated.

It can be seen that after 20 to 30 minutes of cooling in region II the temperature of A or A' for device #1 is of the order of 5° C. greater than that for the other devices. According to the invention, the temperature is measured after 20 minutes cooling time and compared with a reference value, such as 40° C. It is not necessary with the invention to monitor the temperature throughout the whole of the ageing and cooling process. The device with the electron beams on and deflected according to the invention has a measured temperature greater than the reference temperature, it is therefore established that secondary electron charge has been generated in this device. Other devices such as #2 or #3 have a measured temperature after 20 minutes cooling that is below the reference temperature. The ageing process can be repeated on these devices and the temperature remeasured to ensure that the secondary electron charge has been produced.

The reference temperature can be selected depending on various conditions such as the duration and temperature of the preceding ageing process, the length of cooling time before the measurement of the temperature and the cooling temperature, and the particular size and type of the CRT. The reference temperature could be above or below the ageing temperature. The ageing process itself is not essential to the invention; the secondary electron charge generating process may be carried out separately. The requirement is that when the electron beams are deflected to hit the funnel, a measurably higher temperature is produced at some later time, relative to the temperature in the case in which the electron beams are not switched on for sufficient time to generate adequate secondary electron charge. It is, however, convenient to produce the secondary electron charge during the ageing process.

After it has been determined, by the measured temperature being above the reference temperature, that the secondary electron charge has been generated, the convergence of the electron beams of the CRT can be adjusted. It is then known that the CRT should not need subsequent convergence adjustment. This results in an improved quality product.

The method of this invention allows it to be determined whether the electron beams of a CRT were on for a predetermined length of time, such as during the ageing process, fulfilling condition (1) so that secondary electron charge is generated on the inner surface of the neck of the CRT. With the invention it is not necessary to monitor continuously every CRT during the ageing process to check that the electron beams are on which would require much equipment and/or be laborious. The invention enables the required proof of secondary electron charge to be obtained by one temperature measurement on each CRT before adjusting the convergence.

While the present invention has been described and illustrated in connection with a preferred embodiment, it is not to be limited thereby, and it should be understood by those skilled in the art that various modifications, adaptions and alterations thereof may be made within the spirit of the present invention which is defined by the following claims.

What is claimed is:

1. A method for determining, for a cathode ray tube comprising a funnel and having an inner surface, whether electronic charge has been accumulated on said inner surface comprising the steps of:

generating at least one electron beam within said cathode ray tube;

deflecting said at least one electron beam so that it hits the inner surface of the funnel of the cathode ray tube;

measuring the temperature of a predetermined portion of the cathode ray tube; and comparing the measured temperature with a predetermined reference temperature value to determine whether electronic charge has been accumulated on said inner surface of the cathode ray tube.

2. A method according to claim 1, wherein it is determined that said electronic charge has accumulated if the measured temperature is greater than or equal to the reference temperature.

3. A method according to claim 1, wherein said predetermined portion of the cathode ray tube is located on the wall of the funnel of the cathode ray tube.

4. A method according to claim 1, wherein the temperature is measured using a non-contact thermometer.

5. A method according to claim 1, wherein a deflection yoke surrounds the cathode ray tube where the at least one electron beam hits the inner surface of the funnel of the cathode ray tube.

6. A method according to claim 5, wherein said portion of the cathode ray tube is away from where the inner surface of the funnel of the cathode ray tube is hit by said at least one electron beam.

7. A method according to claim 1, wherein said deflecting step further comprises rastering said at least one electron beam.

8. A method according to claim 7, wherein said at least one electron beam is rastered for a first length of time.

9. A method according to claim 8, wherein said first length of time is substantially 2 hours.

10. A method according to claim 7, wherein the cathode ray tube further comprises a screen across which said at least one electron beam is rastered to produce a screen brightness, and wherein the total current of the or all the electron beams is such that the screen brightness is substantially 60 cd/M$^2$.

11. A method according to claim 8, wherein the cathode ray tube further comprises a screen across which said at least one electron beam is rastered to produce a screen brightness, and wherein the product of the first length of time in minutes and the screen brightness during that period in cd/m$^2$ is at least 6000.

12. A method according to claim 1, wherein said cathode ray tube is subjected to an ageing process during said deflection step at an elevated ambient temperature.

13. A method according to claim 12, wherein said elevated ambient temperature is 40° C.

14. A method according to claim 1, wherein said cathode ray tube is subjected to a cooling process before the temperature measuring step.

15. A method according to claim 14, wherein said temperature measuring step is performed 20 minutes or more after the start of the cooling process.

16. A method according to claim 14, wherein said cooling process comprises allowing the cathode ray tube to cool in an environment having a temperature of 25° C.

17. A method of manufacturing a cathode ray tube having a plurality of electron beams, comprising a method according to claim 1, and further comprising the step of optimizing the convergence of the electron beams if the measured temperature is equal to or exceeds the reference temperature, otherwise further comprising repeating said generating, deflecting, measuring and comparing steps.

* * * * *